(12) United States Patent
Groen et al.

(10) Patent No.: US 6,956,442 B2
(45) Date of Patent: Oct. 18, 2005

(54) RING OSCILLATOR WITH PEAKING STAGES

(75) Inventors: Eric D. Groen, Ankeny, IA (US);
Charles W. Boecker, Ames, IA (US);
William C. Black, Ames, IA (US);
Michael J. Gaboury, Burnsville, NM (US)

(73) Assignee: Xilinx, Inc., San Jose, CA (US)

( * ) Notice: Subject to any disclaimer, the term of this patent is extended or adjusted under 35 U.S.C. 154(b) by 134 days.

(21) Appl. No.: 10/659,978

(22) Filed: Sep. 11, 2003

(65) Prior Publication Data

US 2005/0057315 A1 Mar. 17, 2005

(51) Int. Cl.[7] .............................................. H03B 27/00
(52) U.S. Cl. ........................ 331/57; 331/34; 331/36 C; 331/177 R; 327/261; 327/264; 327/156; 327/158; 375/376
(58) Field of Search .......................... 331/57, 34, 36 C, 331/177 R; 327/261, 264, 156, 158; 375/376

(56) References Cited

U.S. PATENT DOCUMENTS

| | | | | |
|---|---|---|---|---|
| 5,334,891 A | * | 8/1994 | Marbot | 327/281 |
| 5,793,239 A | * | 8/1998 | Kovacs et al. | 327/262 |
| 6,351,191 B1 | | 2/2002 | Nair et al. | |
| 6,831,492 B1 | * | 12/2004 | Abbasi et al. | 327/158 |

OTHER PUBLICATIONS

U.S. Appl. No. 10/659,803, filed Sep. 11, 2003, Black et al.
U.S. Appl. No. 10/659,971, filed Sep. 11, 2003, Boecker et al.
Seema Butala Anand et al.; "A CMOS Clock Recovery Circuit for 2.5–Gb/s NRZ Data"; 2001 IEEE; IEEE Journal of Solid–State Circuits, vol. 36, No. 3, Mar. 2001; pp. 432–439.

John D. van der Tang et al.; "A 9.8–11.5 GHz Quadrature Ring Oscillator for Optical Receivers"; 2002 IEEE; IEEE Journal of Solid–State Circuits, vol. 37, No. 3; Mar. 2002; pp. 438–442.

Seong–Jun Song et al.; "A 4–Gb/s CMOS Clock and Data Recovery Circuit Using 1/8–Rate Clock Technique"; 2003 IEEE; IEEE Journal of Solid–State Circuits, vol. 38, No. 7; Jul. 2003; pp. 1213–1219.

Werner Baumberger; "A Single Chip Image Rejecting Downconverter for the 2.44 GHz Band"; Gallium Arsenide Integrated Circuit (GAAS IC) Symposium; 1993; 15th Annual; 10–13 Oct. 1993; pp. 37–40.

A Worapishet et al.; "An NMOS Inductive Loading Technique for Extending Operating Frequency CMOS Ring Oscillators"; The 2002 45th Midwest Symposium on Circuits and Systems; Conference Proceedings; Aug. 4–7, 2002; IEEE, vol. 1 of 3; Aug. 4, 2002; pp. 1–116 to I–119.

* cited by examiner

*Primary Examiner*—Arnold Kinkead
(74) *Attorney, Agent, or Firm*—James Harrison

(57) ABSTRACT

A ring oscillator with a plurality of delay stages having selectable active loads for selecting an R-C time constant that defines a delay through the delay stage. The ring oscillator oscillation frequency is a function of the selected R-C time constant, a selectable bias level, and the number of delay stages in the ring oscillator. In one embodiment, a MOSFET device gate-to-source capacitance is used with at least one selectable resistive device to form the R-C time constant. In an alternate embodiment, a plurality of parallel coupled resistive devices and parallel coupled capacitive devices are selectively coupled to the active load circuit to set the delay through the delay stage. The resistive devices are formed to be one of a resistor configured MOSFET device and a traditional resistive element. The capacitive devices are formed to be one of a capacitor configure MOSFET device and a traditional capacitive element.

23 Claims, 14 Drawing Sheets programmable logic device 10 programmable multi-gigabit transceivers 14-28 programmable receive PMA module 40 programmable transmit PMA module 38 ring oscillator 170

NMOS delay stage circuit 194 gate-to-source capacitance

NMOS delay stage response

PMOS delay stage circuit

PMOS delay stage circuit

PMOS delay stage response delay stage circuit method

RING OSCILLATOR WITH PEAKING STAGES

BACKGROUND OF THE INVENTION

1. Technical Field of the Invention

This invention relates generally to communication systems and more particularly to oscillator circuits used therein.

2. Description of Related Art

Communication systems are known to transport large amounts of data between a plurality of end user devices, which, for example, include telephones, facsimile machines, computers, television sets, cellular telephones, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits-per-second, 100 megabits per second, 1 gigabit per second and beyond. Synchronous Optical NETwork (SONET), for example, currently provides for up to 10 gigabits per second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss.

Accurate recovery of information from high-speed serial transmissions typically requires transceiver components that operate at clock speeds equal to or higher than the received serial data rate. Higher clock speeds require oscillator circuits to have gain-bandwidth products to sustain high frequency oscillations while maintaining low phase noise. High phase noise contributes to clock jitter which degrades clock recovery in high speed circuits. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits. Integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits per second for OC48, to 9.95 gigabits per second for OC192. Other known standards define data rates of 2.5 gigabits per second (INFINIBAND) or 3.125 gigabits per second (XAUI). For example, one protocol may specify a peak voltage range of 200–400 millivolts, while another standard specifies a mutually exclusive voltage range of 500–700 millivolts. Thus, a designer either cannot satisfy these mutually exclusive requirements (and therefore cannot support multiple protocols) or must design a high data rate transceiver device that can adapt according to the protocol being used for the communications.

Along these lines, field programmable gate array (FPGA) circuits are gaining in popularity for providing the required flexibility and adaptable performance described above for those designers that seek to build one device that can operate according to multiple protocols. Thus, while FPGA technology affords a designer an opportunity to develop flexible and configurable hardware circuits, specific designs that achieve the desired operations must still be developed. Accordingly, there is a need for oscillator circuits within a transceiver device that achieves these design objectives. While traditional phase-locked loops include mechanical oscillators that produce an oscillation based on a current, integrated circuit designs desirably include oscillators formed from integrated circuit devices. There is a need therefore, for an integrated circuit based oscillator that provides the desired oscillations in a variable manner within specified noise constraints.

BRIEF SUMMARY OF THE INVENTION

An embodiment of the present invention includes a delay stage circuit of a ring oscillator for setting a delay value of the delay stage circuit and a corresponding frequency of operation of the ring oscillator. The delay stage circuit comprises a differential transistor pair for receiving an input oscillation signal and for producing a corresponding output oscillation signal characterized by a delay. The differential transistor pair is coupled to receive a bias signal, set by an external bias circuit, to provide a fine delay adjustment to a selectable frequency of oscillation set by an active load.

In one embodiment, the active load, comprising a pair of MOSFET devices coupled to a selectable resistive load, generates an R-C time constant of the active load that defines the delay of the differential transistor pair. A fixed capacitance is provided by the structure of the pair of MOSFET devices. Because the resistive load has selectable resistance values, the R-C time constant of the active load is adjustable. As the R-C time constant affects an amount of delay of the output oscillation signal relative to the input oscillation signal, a frequency of oscillation may be set by the resistive devices coupled within the active load.

In one embodiment, a plurality of resistive and capacitive devices are selectively coupled to the active load to define the delay of the differential transistor pair. The frequency of oscillation of the ring oscillator is a function of the delay of each delay stage circuit of the ring oscillator as set by the selectable active loads and a function of the externally provided bias signal. The bias signal adjusts a bias level of the differential transistor pair by opening or closing at least one of a plurality of selectable switches thereby adjusting a response time and associated delay through the transistor pair. The logic to close one of the plurality of selectable switches operates under one of manual control or automatic control to select the ring oscillator frequency of oscillation.

In each embodiment of the invention, responsive to resistive and capacitive devices values, whether permanently or selectively coupled, the differential transistor pair will produce an output oscillation signal that has a peak response at an oscillation frequency that corresponds to the R-C time constant set by the resistive and capacitive values.

DETAILED DESCRIPTION OF THE INVENTION

Figure 1:
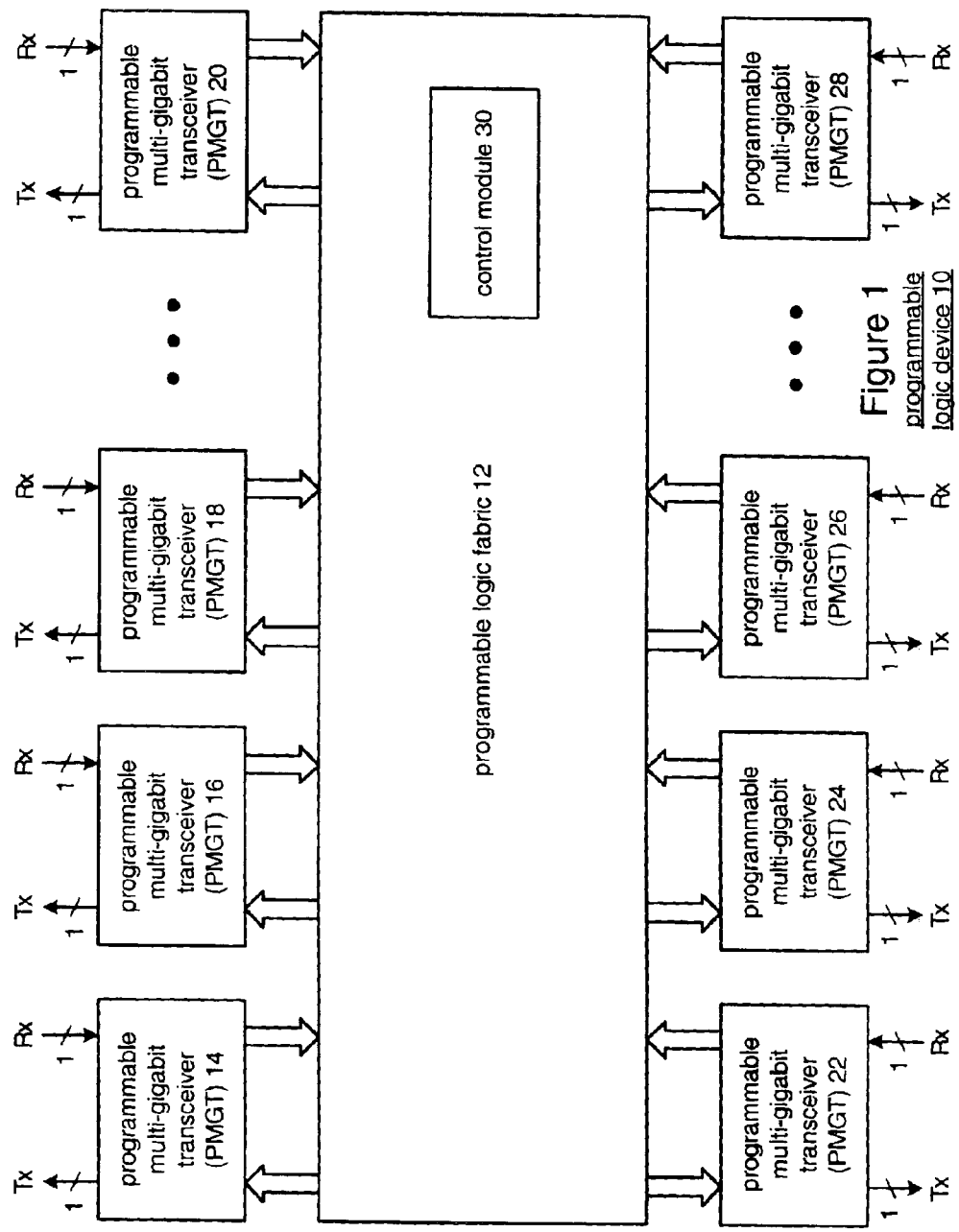
FIG. 1 is a schematic block diagram of a programmable logic device that includes programmable logic fabric and a plurality of programmable multi-gigabit transceivers (PMGTS) and a control module.

FIG. 1 is a schematic block diagram of a programmable logic device 10 that includes programmable logic fabric 12, a plurality of programmable multi-gigabit transceivers (PMGTs) 14–28 and a control module 30. The programmable logic device 10 may be a programmable logic array device, a programmable array logic device, an erasable programmable logic device, and/or a field programmable gate array (FPGA). When the programmable logic device 10 comprises an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, control module 30 generates control signals to program transmit and receive sections of each of the PMGTs 14–28. In general, each of the PMGTs 14–28 performs a serial-to-parallel conversion on receive data and performs a parallel-to-serial conversion on transmit data. The parallel data may be, for instance, 8-bits wide, 16-bits wide, 32-bits wide, or 64-bits wide.

Typically, the serial data will be a 1-bit stream of data that may be a binary level signal, multi-level signal, etc. Further, two or more programmable multi-gigabit transceivers may be bonded together to provide greater transmitting speeds. For example, if PMGTs 14, 16 and 18 are transceiving data at 3.125 gigabits-per-second, the PMGTs 14, 16 and 18 may be bonded together such that the effective serial rate is approximately 3 times 3.125 gigabits-per-second.

Each of the programmable multi-gigabit transceivers 14–28 may be individually programmed to conform to separate standards. In addition, the transmit path and receive path of each programmable multi-gigabit transceiver 14–28 may be separately programmed such that the transmit path of a transceiver is supporting one standard while the receive path of the same transceiver is supporting a different standard. Further, the serial rates of the transmit path and receive path may be programmed, for example, from 1 gigabit-per-second to tens of gigabits-per-second. The size of the parallel data in the transmit and receive sections, or paths, is also programmable and may vary, for instance, from 8-bits, 16-bits, 32-bits, or 64-bits.

Figure 2:
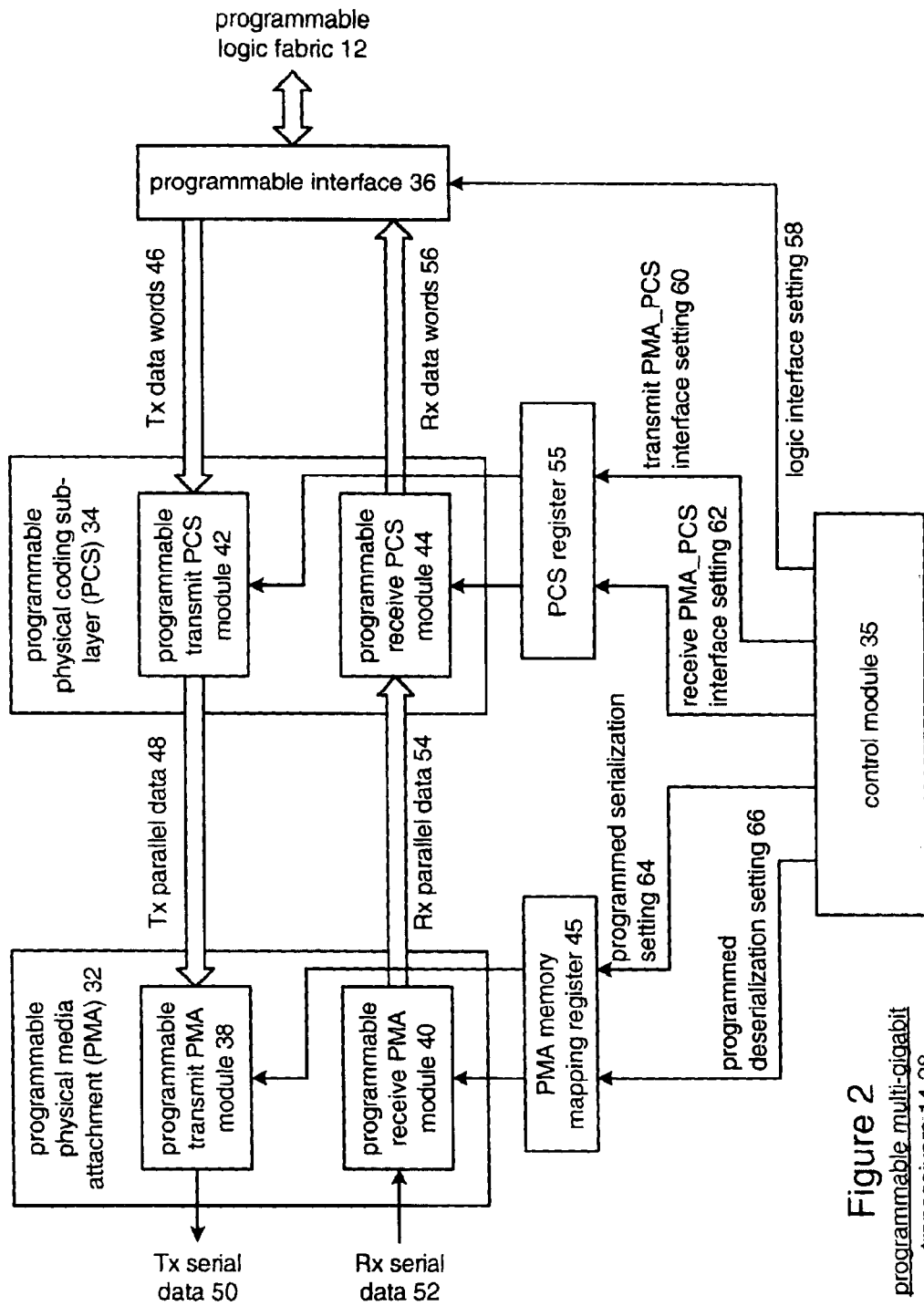
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14–28. As shown, the programmable multi-gigabit transceiver includes a programmable physical media attachment (PMA) module 32, a programmable physical coding sub-layer (PCS) module 34, a programmable interface 36, a control module 35, a PMA memory mapping register 45 and a PCS register 55. The control module 35, based on the desired mode of operation for the individual programmable multi-gigabit transceiver 14–28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30 of FIG. 1.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58–66.

The programmable physical media attachment (PMA) module 32 includes a programmable transmit PMA module 38 and a programmable receive PMA module 40. The programmable transmit PMA module 38, which will be described in greater detail with reference to FIG. 4B, is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable physical coding sub-layer (PCS) module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., 1-byte, 2-bytes, 3-bytes, 4-bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA module 32 and PCS module 34 may be individually programmed to support a desired data transfer rate. The data transfer rate may be in accordance with a particular standard such that the receive path, i.e., the path through programmable receive PMA module 40 and the programmable receive PCS module 44 may, be programmed in accordance with one standard, while the transmit path, i.e., the path through the programmable transmit PCS module 42 and the programmable transmit PMA module 38, may be programmed in accordance with the same or another standard.

Figure 3:
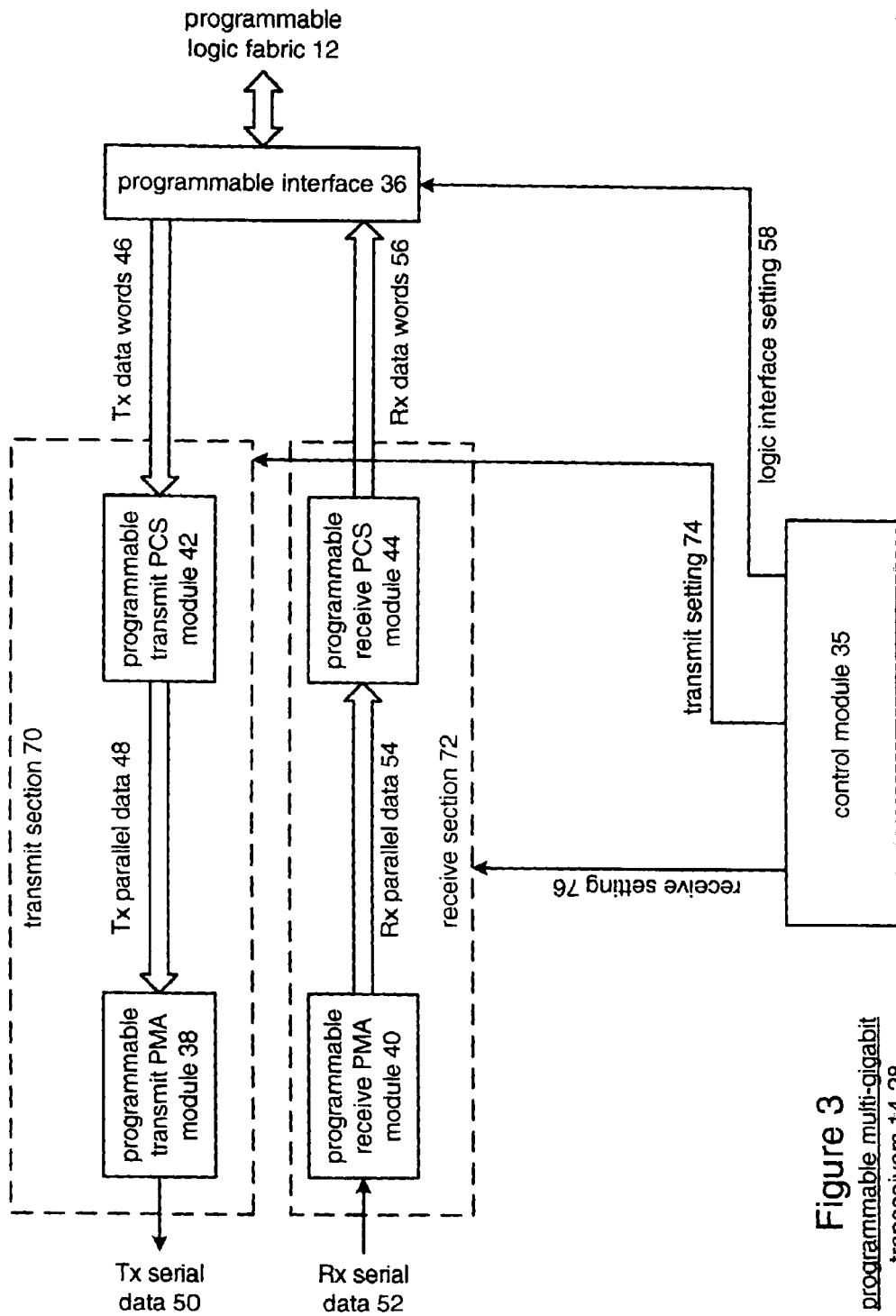
FIG. 3 illustrates an alternate schematic block diagram of a representative one of the programmable multi-gigabit transceivers.

FIG. 3 illustrates an alternate schematic block diagram of a representative one of the PMGTs 14–28. In this embodiment, the PMGTs 14–28 include a transmit section 70, a receive section 72, the control module 35 and the programmable interface 36. The transmit section 70 includes the programmable transmit PMA module 38 and the programmable transmit PCS module 42. The receive section 72 includes the programmable receive PMA module 40 and the programmable receive PCS module 44.

In this embodiment, the control module 35 separately programs the transmit section and the receive section via transmit setting 74 and receive setting 76, respectively. The control module 35 also programs the programmable interface 36 via the logic interface setting 58. Accordingly, the control module 35 may program the receive section 72 to function in accordance with one standard while programming the transmit section 70 in accordance with the same or another standard. Further, the logic interface setting 58 may indicate that the transmit data words 46 are received from the programmable logic fabric 12 at a different rate than the receive data words 56 are provided to the programmable logic fabric 12. As one of average skill in the art will appreciate, the programmable interface 36 may include a transmit buffer and a receive buffer, and/or an elastic store buffer to facilitate the providing and receiving of transmit data words 46 and receive data words 56 to and from the programmable logic fabric 12.

Figure 4A:
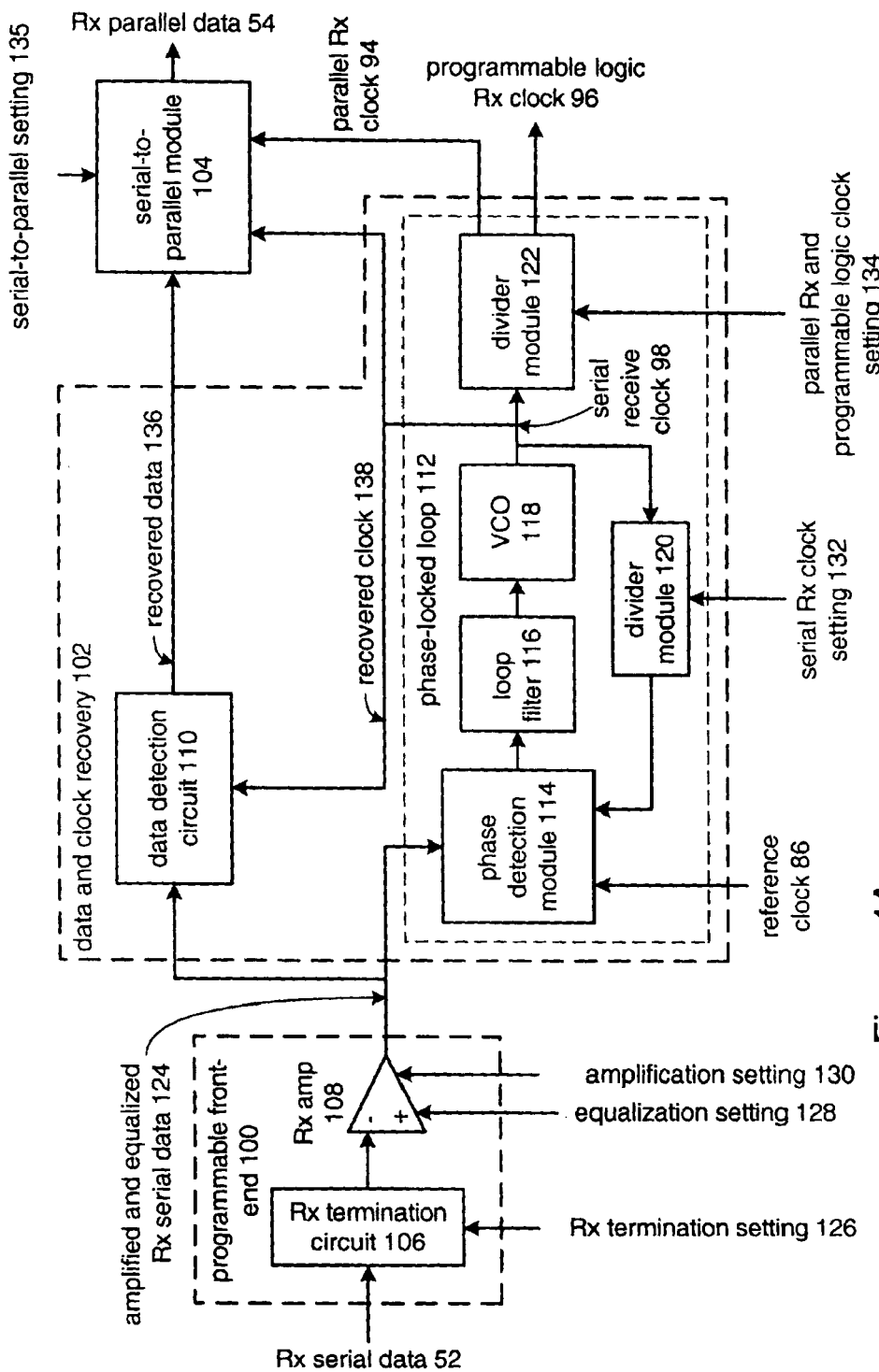
FIG. 4A illustrates a schematic block diagram of the programmable receive PMA module that includes a programmable front-end, a data and clock recovery module, and a serial-to-parallel module.
Figure 4B:
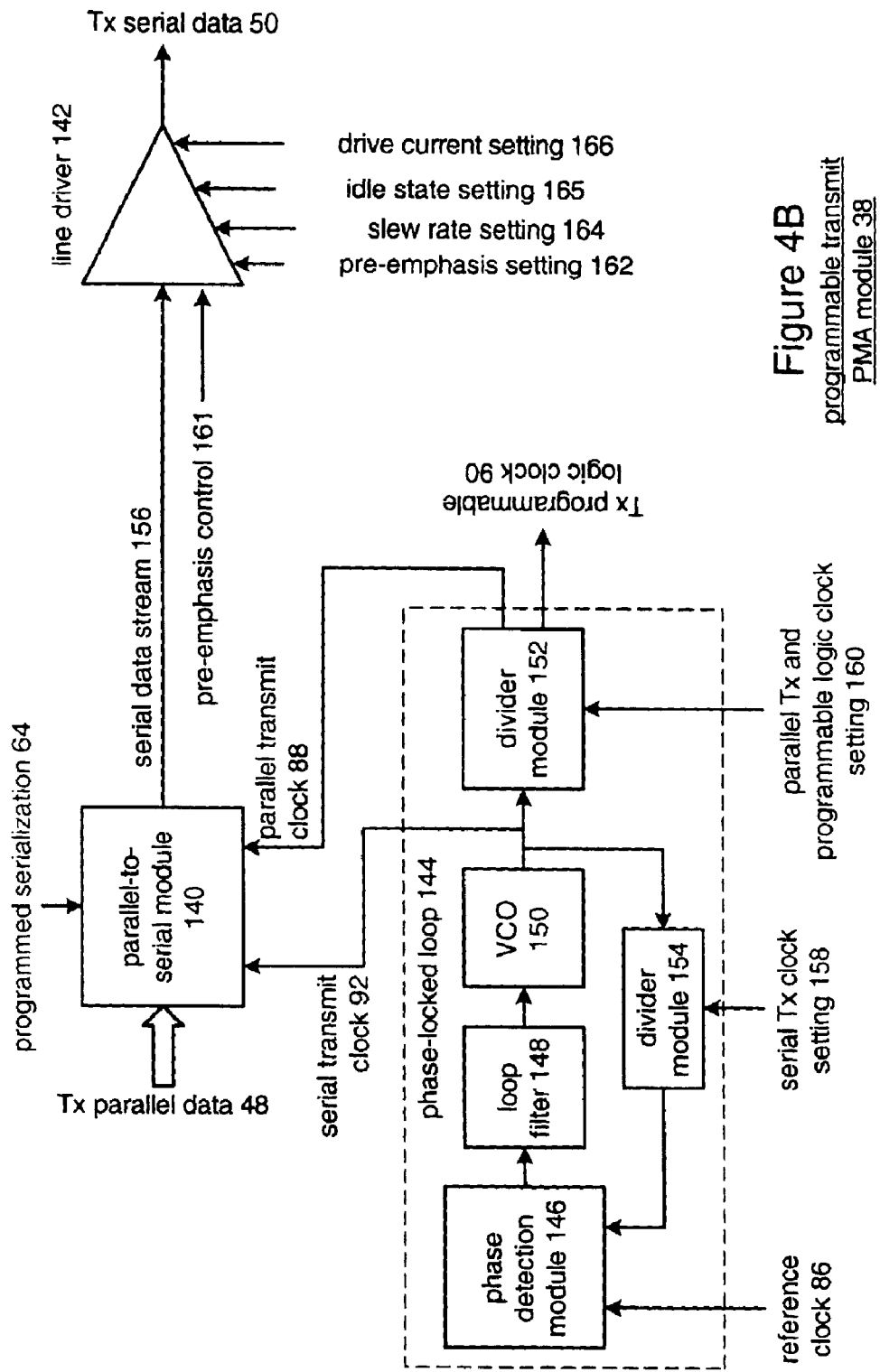
FIG. 4B illustrates a schematic block diagram of a programmable transmit PMA module that includes a phase locked loop, a parallel-to-serial module, and line driver.

FIG. 4A illustrates a schematic block diagram of the programmable receive PMA module 40 that includes a programmable front-end 100, a data and clock recovery module 102, and a serial-to-parallel module 104. The programmable front-end 100 includes a receive termination circuit 106 and a receive amplifier 108. The data and clock recovery module 102 includes a data detection circuit 110 and a phase locked loop 112. The phase locked loop 112 includes a phase detection module 114, a loop filter 116, a voltage controlled oscillator (VCO) 118, a $1^{st}$ divider module 120, and a $2^{nd}$ divider module 122.

The programmable front-end 100 is operably coupled to receive the receive serial data 52 and produce amplified and equalized receive serial data 124 therefrom. To achieve this, the receive termination circuit 106 is programmed in accordance with a receive termination setting 126 to provide the appropriate termination for the transmission line between the programmable receive PMA module 40 and the source that originally transmitted the receive serial data 52. The receive termination setting 126 may indicate whether the receive serial data 52 is a single-ended signal, a differential signal, may indicate the impedance of the transmission line, and may indicate the biasing of the receive termination circuit 106. For a more detailed discussion of the receive termination circuit 106, refer to co-pending patent application by Charles W. Boecker et al. entitled RECEIVER TERMINATION NETWORK AND APPLICATION THEREOF, having a filing date the same as the present patent application. This co-pending application is incorporated by reference, herein.

The receive termination circuit 106 further biases the receive serial data 52 and provides the bias adjusted signal to the receive amplifier 108. The equalization and gain settings of the receive amplifier 108 may be adjusted in accordance with equalization setting 128 and amplification setting 130, respectively. Further description of the receiver amplifier 108 may be found in co-pending patent application by William C. Black et al. entitled ANALOG FRONT-END HAVING BUILT-IN EQUALIZATION AND APPLICATIONS THEREOF, having a filing date the same as the present patent application. This co-pending application is incorporated by reference, herein. Note that the receive termination setting 126, the equalization setting 128, and the amplification setting 130 are part of the programmed deserialization setting 66 provided by the control module 35.

The data and clock recovery module 102 and the phase detection module 114 of phase-locked loop 112 receive the amplified and equalized receive serial data 124. The phase detection module 114 has been initialized prior to receiving the amplified and equalized receive serial data 124 by comparing the phase and/or frequency of a reference clock 86 with a feedback reference clock produced by divider module 120. Based on this phase and/or frequency difference, the phase detection module 114 produces a corresponding current that is provided to loop filter 116. The loop filter 116 converts the current into a control voltage that adjusts the output frequency of the VCO 118. The divider module 120, based on a serial receive clock setting 132, divides the output oscillation produced by the VCO 118 to produce the feedback signal. Once the amplified and equalized receive serial data 124 is received, the phase detection module 114 compares the phase of the amplified and equalized receive serial data 124 with the phase of the feedback signal, and produces a current signal based on the phase difference.

The phase detection module 114 provides the current signal to loop filter 116, which converts it into a control voltage that controls the output frequency of the voltage controlled oscillator 118. At this point, the output of the voltage controlled oscillator 118 corresponds to a recovered clock 138 in steady state operation. The recovered clock 138 is provided to the divider module 122, the data detection circuit 110 and to the serial-to-parallel module 104. The data detection circuit 110 utilizes the recovered clock 138 to produce recovered data 136 from the amplified and equalized receive serial data 124. The divider module 122 divides the recovered clock 138, in accordance with a parallel receive and programmable logic clock setting 134, to produce a parallel receive clock 94 and a programmable logic receive clock 96. Note that the serial receive clock setting 132 and the parallel receive and programmable logic clock setting 134 are part of the programmed deserialization setting 66 provided to the programmable receive PMA module 40 by the control module 35.

The serial-to-parallel module 104, which may include an elastic store buffer, receives the recovered data 136 at a serial rate in accordance with the recovered clock 138. Based on a serial-to-parallel setting 135 and the parallel receive clock 94, the serial-to-parallel module 104 outputs the receive parallel data 54. The serial-to-parallel setting 135, which may be part of the programmed deserialization setting 66, indicates the data rate and data width of the receive parallel data 54.

FIG. 4B illustrates a schematic block diagram of a programmable transmit PMA module 38 that includes a phase locked loop 144, a parallel-to-serial module 140, and a line driver 142. The phase locked loop 144 includes a phase detection module 146, a loop filter 148, a voltage controlled oscillator (VCO) 150, a divider module 154, and a divider module 152.

The phase detection module 146 compares the phase and/or frequency of the reference clock 86 with the phase and/or frequency of an output produced by divider module 154. The phase detection module 146 generates a current signal to represent the phase and/or frequency difference between the reference clock 86 and the feedback oscillation. The loop filter 148 converts the current signal into a control voltage that regulates the output oscillation produced by the VCO 150. Divider module 154, based on a serial transmit clock setting 158, divides the output oscillation of the VCO 150, which corresponds to a serial transmit clock 92, to produce the feedback oscillation. Note that the serial transmit clock setting 158 may be part of the programmed serialization setting 64 provided to the programmable transmit PMA module 38 by the control module 35.

Divider module 152 receives the serial transmit clock 92 and, based on a parallel transmit and programmable logic clock setting 160, produces a parallel transmit clock 88 and a transmit programmable logic clock 90. The parallel transmit and programmable logic clock setting 160 may be part of the programmed serialization setting 64.

The parallel-to-serial module 140 receives the transmit parallel data 48 and produces therefrom a serial data stream 156. To facilitate the parallel-to-serial conversion, the parallel-to-serial module 140, which may include an elastic store buffer, receives a parallel-to-serial setting to indicate the width of the transmit parallel data 48 and the rate of the transmit parallel data, which corresponds to the parallel transmit clock 88. Based on the parallel-to-serial setting, the serial transmit clock 92 and the parallel transmit clock 88, the parallel-to-serial module 140 produces the serial data stream 156 from the transmit parallel data 48.

The line driver 142 increases the power of the signals forming serial data stream 156 to produce the transmit serial data 50. The line driver 142, which is described in greater detail in co-pending patent applications related applications listed above and having the same filing date as the present application, may be programmed to adjust its pre-emphasis settings, slew rate settings, and drive settings via a pre-emphasis control signal 161, a pre-emphasis setting signal 162, a slew rate setting signal 164, an idle state setting 165 and a drive current setting 166. The pre-emphasis control signal 161, the pre-emphasis setting signal 162, the slew rate setting signal 164, the idle state setting 165 and the drive current setting 166 may be part of the programmed serialization setting 64. As one of average skill in the art will appreciate, while the diagram of FIG. 4B is shown as a single-ended system, the entire system may use differential signaling and/or a combination of differential and single-ended signaling.

Figure 5:
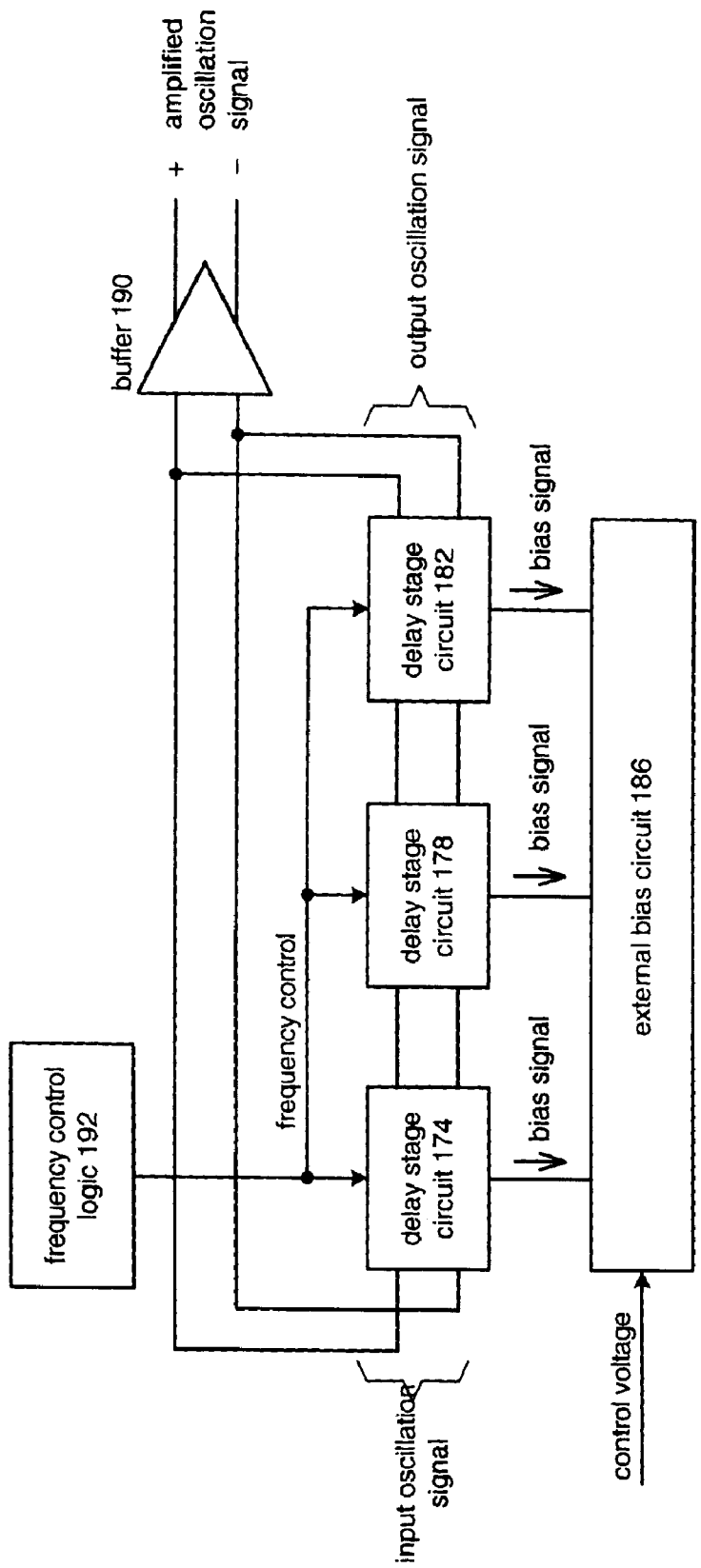
FIG. 5 is a schematic block diagram of a ring oscillator according to an embodiment of the present invention.

FIG. 5 is a schematic block diagram of a ring oscillator according to an embodiment of the present invention. A ring oscillator, as is known to one of average skill in the art, utilizes a plurality of delay stages to provide a loop gain equal to or greater than one and a 180 degree phase shift between an input and an output, thereby sustaining oscillation. As can be seen in FIG. 5, a ring oscillator 170 includes a plurality of delay stage circuits, namely, delay stage circuits 174, 178 and 182, to provide the necessary phase shift and delay to sustain oscillation. Frequency control logic 192 operably couples a frequency control signal to each delay stage circuit. As will be described in the following figures, frequency control logic 192 selectively adjusts a resistive load in each delay stage circuit to set a ring oscillator delay value and, therefore, a selected oscillation frequency. Each delay stage circuit also produces a peak amplitude at the selected oscillation frequency thereby providing the gain necessary to sustain oscillation. As can also be seen in FIG. 5, a feedback loop is created by coupling an output oscillation signal from delay stage circuit 182 to an input of delay stage circuit 174. The output of delay stage circuit 174 is coupled, in turn, to an input of delay stage circuit 178. An output of delay stage circuit 178 is coupled to an input of delay stage circuit 182 to complete the feedback loop. The output oscillation signal is further coupled to a buffer 190, which presents a high impedance to the ring oscillator and also amplifies the output oscillation signal. An external bias circuit 186 produces bias signals to the delay stage circuits to bias them in an active operating region and to provide a fine control on the delay of each delay stage circuit.

Ring oscillators can be used as a voltage controlled oscillator (VCO) in a phase-locked loop (PLL), such as PLL 112 of FIG. 4A (OR PLL 144 OF FIG. 4B). When used in a PLL, external bias circuit 186 receives a control voltage from a loop filter of the PLL. The control voltage is proportional to the phase difference between a reference clock and the output of the ring oscillator to the control voltage in one embodiment of the invention. Generally, the control voltage magnitude corresponds to a specified frequency of oscillation. Accordingly, changes in the control voltage result in corresponding changes in the bias signals produced to the delay stage circuits therefore resulting in a corresponding change in the delay provided by the delay stage circuits. The change in delay time results in a change of oscillation frequency of the ring oscillator. The control voltage coupled to external bias circuit 186, therefore, adjusts the delay of the delay stage circuits to phase lock the output oscillation signal to the reference signal.

Although three delay stage circuits are shown in FIG. 5, the number of delay stages can be any number as long as they produce the required loop gain and phase shift from the input oscillation signal to the output oscillation signal. In one embodiment of the present invention, six delay stage circuits are used to produce the required phase shift and desired oscillation frequency. Generally, the period of the oscillation frequency is twice the total delay of the ring oscillator circuit.

Figure 6:
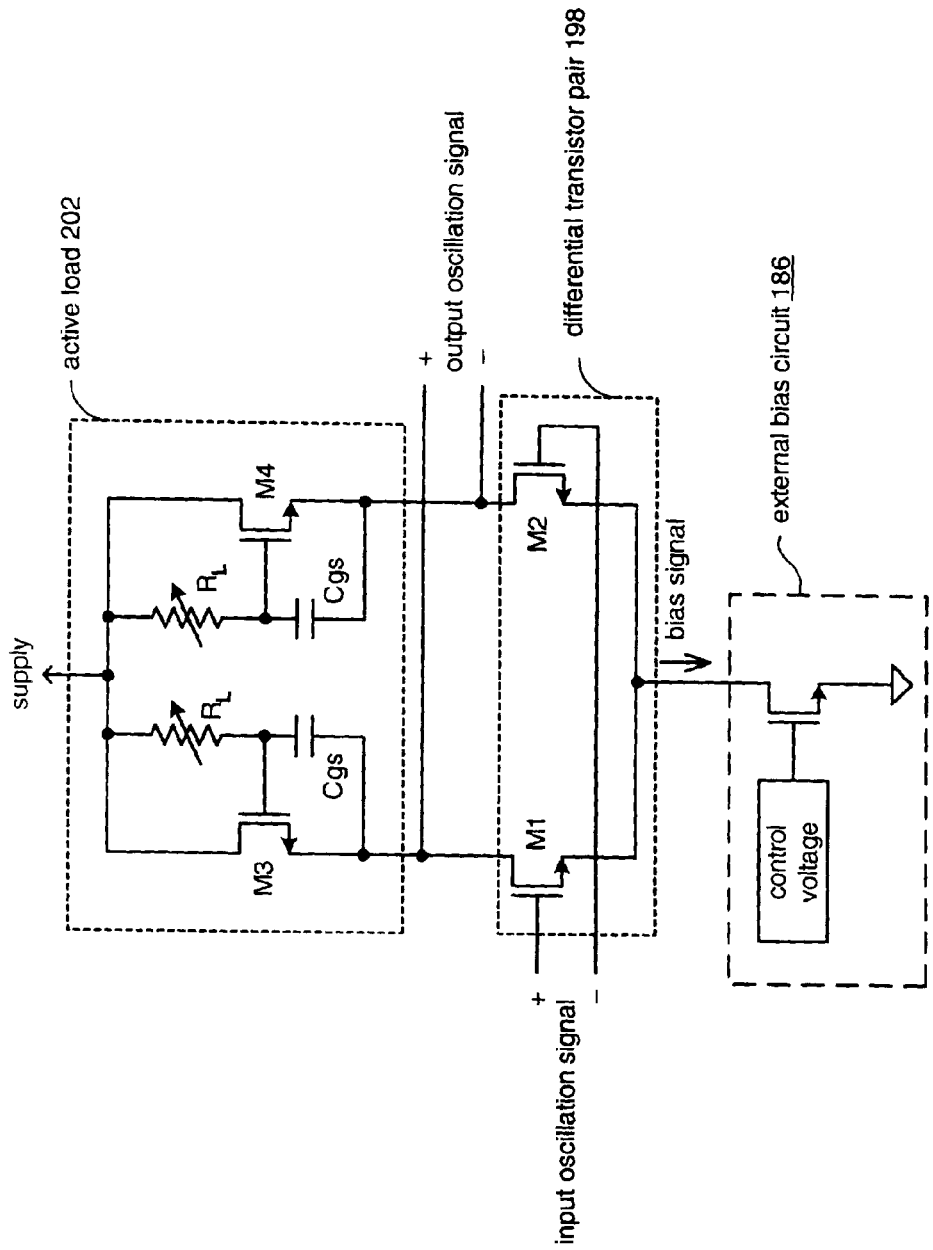
FIG. 6 is a schematic block diagram of an NMOS delay stage circuit according to one embodiment of the present invention.

FIG. 6 is a schematic block diagram of an NMOS delay stage circuit according to one embodiment of the present invention. A delay stage circuit 194 can be used for any of delay stage circuits 174–182 of FIG. 5. A differential transistor pair 198 comprises MOSFET transistors M1 and M2, receives an input oscillation signal and produces an output oscillation signal that is delayed relative to the input oscillation signal. The total delay through the ring oscillator will be the delay through each delay stage circuit multiplied by the number of delay stage circuits in the ring oscillator. An active load 202, coupled to each drain of the differential transistor pair 198, provides level shifting from input to output and additionally provides a peaking function at the oscillation frequency. Active load 202 comprises a pair of MOSFET devices (load transistors), namely, MOSFETs M3 and M4, coupled between differential transistor pair 198 MOSFET transistor drains and a supply. A selectable resistive load $R_L$ is coupled between the supply and the gates of MOSFET devices M3 and M4, respectively. A capacitance Cgs is shown coupled between the gate and source of MOSFET devices M3 and M4. As is known to one of average skill in the art, capacitance Cgs is an internal gate-to-source capacitance of the MOSFET device. For the purposes of discussion, however, capacitance Cgs is shown as a separate element connected to MOSFET devices M3 and M4.

Selectable resistive load $R_L$, when coupled to internal gate-to-source capacitance of MOSFETs M3 and M4, produces a desired R-C time constant to set the input-output delay of the differential transistor pair 198. The R-C time constant set by the selectable resistive load $R_L$ and the gate-to-source capacitance of each delay stage defines the total phase shift and, therefore, the oscillation frequency of the ring oscillator. Normal manufacturing processes produce slight variations in device values so the R-C values form a coarse frequency control and provide for a frequency of operation. A bias signal produced by external bias circuit 186 based on a control voltage from an external circuit (typically from a loop filter in a PLL circuit) effectively forms a fine frequency control to shift the oscillation frequency around the oscillation point defined by $R_L$ and Cgs.

As can be seen in FIG. 6, the output oscillation signal is coupled to one terminal of capacitance Cgs, which is in turn coupled to a resistor of selectable resistive load (collectively "$R_L$"). This forms an effective high pass filter which further causes a peak response at a frequency of oscillation determined by $R_L$ and Cgs. To change the frequency of oscillation, selectable resistive load $R_L$ is adjusted, in one embodiment of the invention, from approximately 75 Ohms to over 3,000 Ohms thereby defining a range of oscillation frequencies from 2.5 GHz to 5 GHz.

Figure 7:
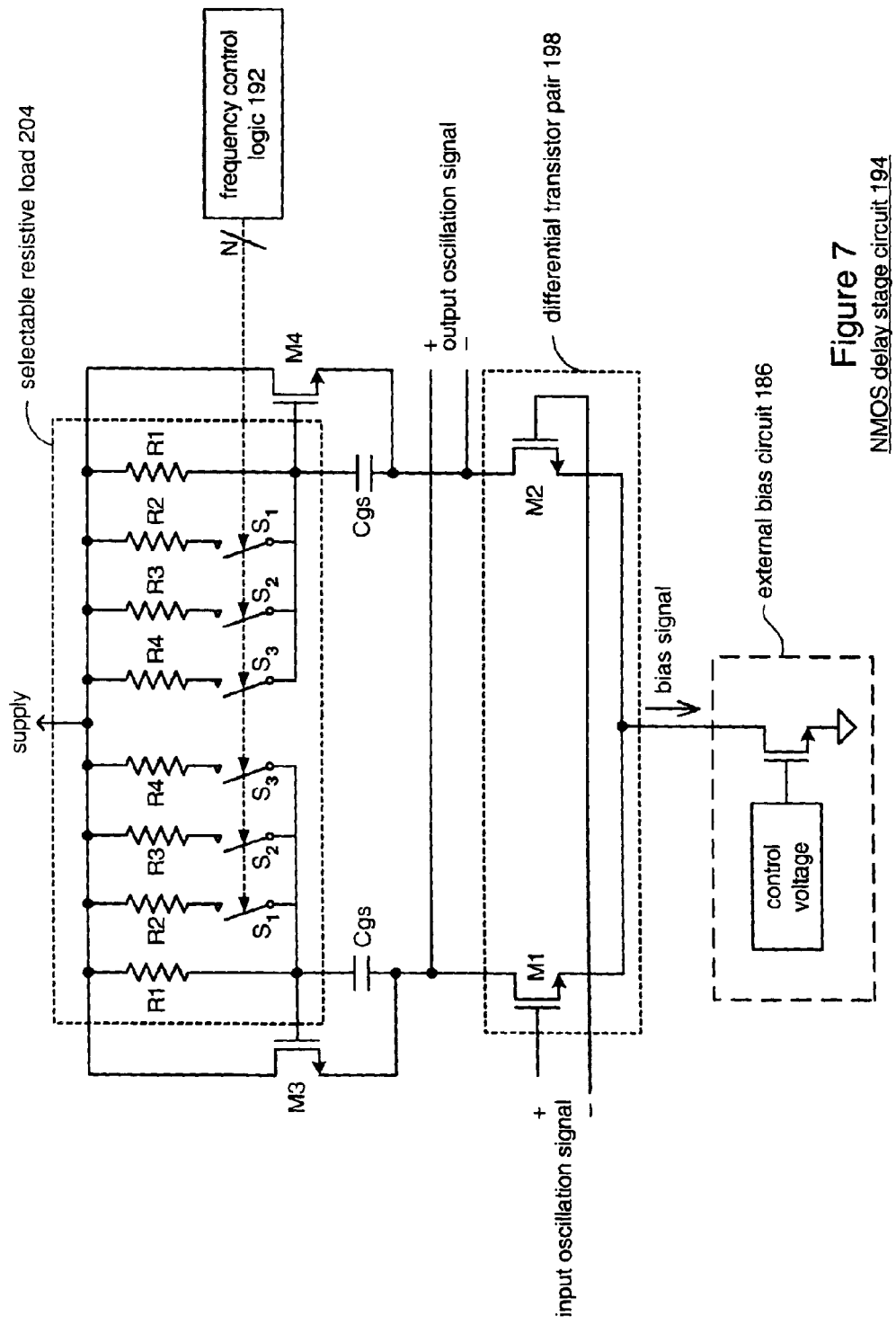
FIG. 7 is a schematic block diagram of the delay stage of FIG. 6 illustrating the adjustment of selectable resistive load $R_L$ to set an oscillation frequency.

FIG. 7 is a schematic block diagram of the NMOS delay stage circuit of FIG. 6 illustrating the adjustment of selectable resistive load $R_L$ to set an oscillation frequency. As can be seen in FIG. 7, selectable resistive load 204 has been replaced with a plurality of parallel coupled resistors, namely, resistors R1, R2, R3 and R4. Resistors R2, R3 and R4 may be formed as resistor configured MOSFETs or as traditional resistive elements. Resistors R2, R3 and R4 are switched into the delay stage circuit by selectable switches S1, S2 and S3 by frequency control logic 192. Selectable switches S1, S2, and S3 are MOSFET devices controlled by logic signals from frequency control logic 192 in the described embodiment, though other switching devices may readily be used. When biased into the triode region, the selectable switches (MOSFET devices) have a very low resistance, and when biased to an off condition have a very high resistance thereby effectively connecting the parallel coupled resistors into and out of the delay stage circuit.

Parallel coupled resistors R1 through R4 are further scaled for desired operating frequencies when selectively coupled to capacitance Cgs. Resistors R1 are permanently connected while resistors R2, R3 and R4 are selectively coupled in parallel to resistors R1 to selectively adjust a total resistive value (to reduce total resistance in the configuration as shown). Frequency control logic 192 selects resistors R2, R3, and R4 in pairs to set the R-C time constant of the delay stage. For example, when frequency control logic 192 closes a switch to select resistors R2, it closes the S1 switch connected to MOSFET devices M3 and M4. When frequency control logic 192 selects one of the parallel coupled resistors thereby setting a coarse operating frequency, external bias circuit 186 provides a fine frequency adjustment by adjusting the operating current through MOSFET devices M1 and M2 of differential transistor pair 198. The operation of frequency control logic 192 may be one of manual operation or automatic operation as is known to one of average skill in the art.

Figure 8:
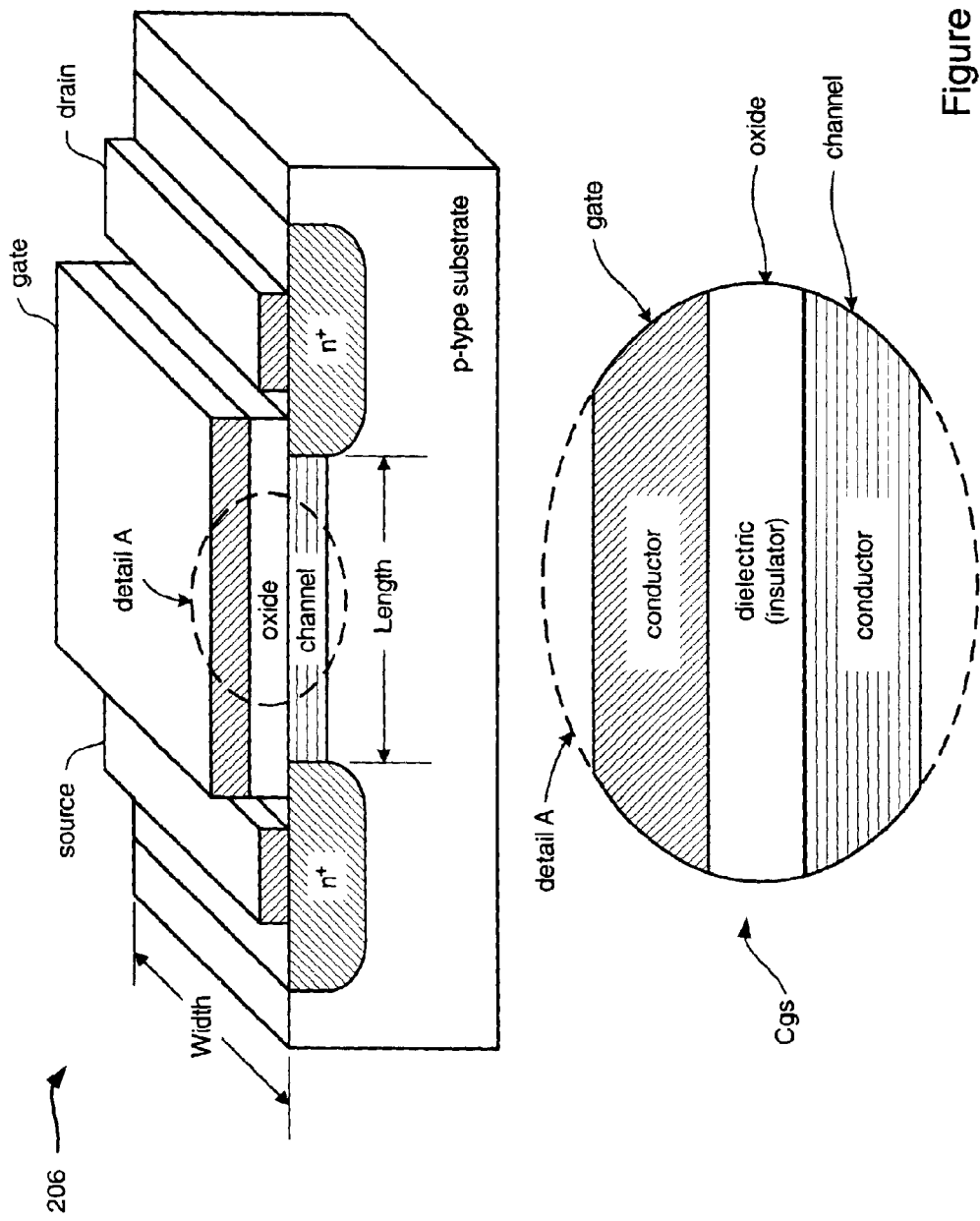
FIG. 8 is a schematic block diagram illustrating gate-to-source capacitance in an N-channel MOSFET.

FIG. 8 is a schematic block diagram illustrating gate-to-source capacitance in an N-channel MOSFET. A capacitor is formed when two parallel plate conductors separated by an insulator are charged with a voltage potential. The capacitance is directly proportional to the area of the parallel plates and inversely proportional to the distance separating the parallel plates. As shown generally at 206, the NMOS channel MOSFET is formed by depositing two heavily doped n-type (n+) regions on a p-type substrate. An insulating oxide layer is deposited on the p-type substrate connecting the two n+ regions. A conducting material is deposited on the oxide layer to create the gate. The source and drain are created by depositing a conductive material over the two n+ regions.

When a positive voltage is applied to the gate, a conductive channel is formed in the p-type substrate beneath the oxide layer thereby creating a conduction channel between the drain and source. As can be seen in detail A, this creates a pair of parallel conductors (gate and channel) separated by an insulator (dielectric) (oxide layer), i.e., a capacitor. The capacitance of the gate-to-source capacitor is directly proportional to the width and length of the channel and inversely proportional to the oxide layer thickness. In one embodiment of the invention, the width of the channel is formed to be 100 microns, while the length of the channel is formed to be 0.3 microns so as to yield a more predictable capacitive value than is provided by the minimum capacitive value of typical IC processes.

When MOSFET 206 is biased in the triode region, the channel is substantially of uniform depth from drain-to-source thus forming a gate-to-source capacitance and a gate-to-drain capacitance. The MOSFET of an embodiment of the present invention is biased in the saturation region. As is known to one of average skill in the art, the saturation region channel is tapered from drain to source with the drain end of the channel substantially pinched off. Therefore, the capacitance formed by the gate and channel is almost entirely due to the gate-to-source capacitance.

Figure 9:
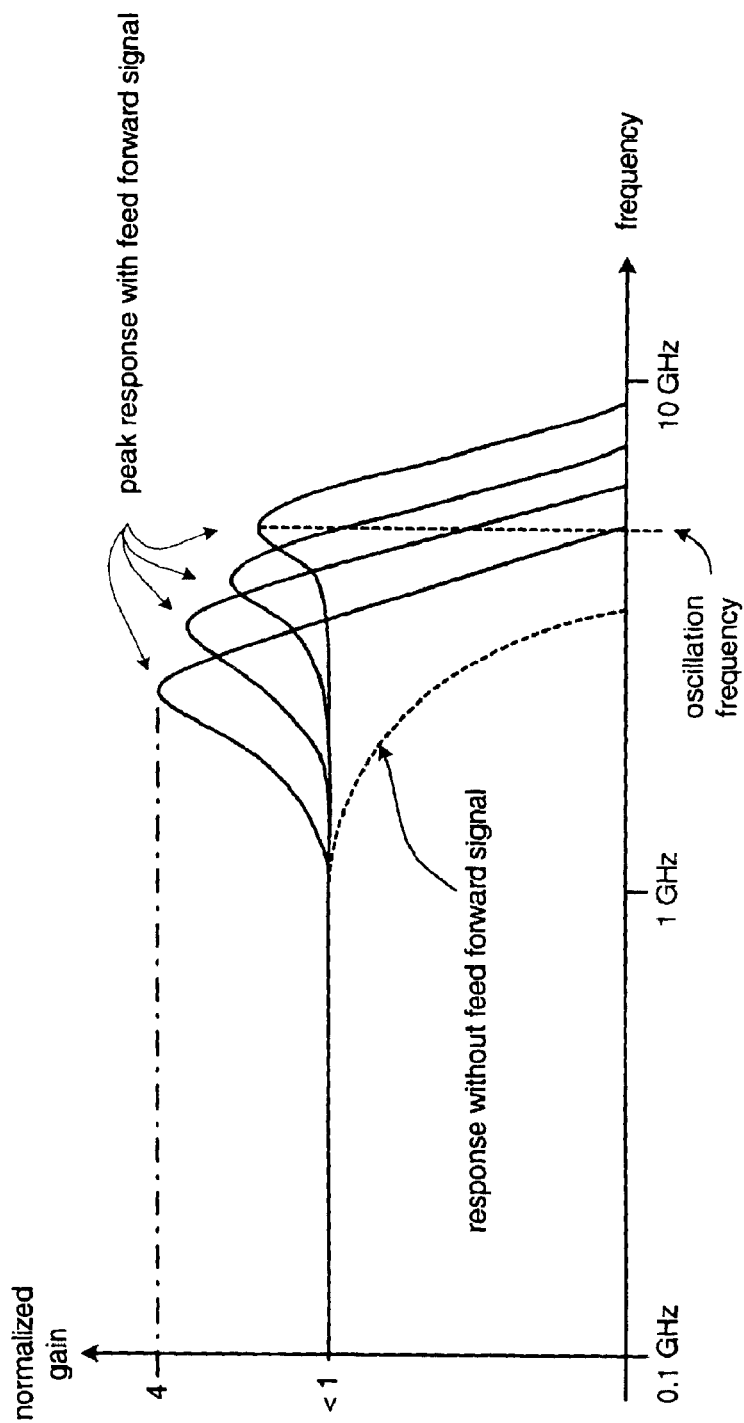
FIG. 9 is a graph of an NMOS delay stage frequency response according to one embodiment of the present invention.

FIG. 9 is a graph of an NMOS delay stage frequency response according to one embodiment of the present invention. As can be seen in FIG. 9, a plurality of frequency response peaks represents the coarse frequency control as selected by frequency control logic 192 of FIG. 7. The feed forward affect of capacitance Cgs and the resulting high pass filter formed by Cgs and the parallel coupled resistors produces the peak response at the oscillation frequency. The cell can be configured so the low frequency gain is less than one while providing gain greater than one at the oscillation frequency. The oscillation frequency may also be increased or decreased based on changes in the bias signal produced by external bias circuit (external bias circuit 186 of FIG. 5). Also illustrated in FIG. 9 is a frequency response curve of the NMOS delay stage circuit without the feed forward signal from capacitance Cgs. The gain of this response curve rolls off at higher frequencies rendering the circuit unable to sustain oscillations.

In one embodiment of the invention, the parallel coupled resistors are selected, in conjunction with typical values of the gate-to-source capacitance, to produce oscillation frequencies of 2.5, 3.125, 4.0 and 5.0 GHz. As can be further seen, without the feed forward signal due to Cgs, the output oscillation signal would roll off at higher frequencies. With the feed forward signal, however, the output amplitude peaks as a function of frequency with a gain of approximately 4 times that of the peak without the feed forward signal. This peaking has several benefits including its usefulness in noise reduction.

Figure 10:
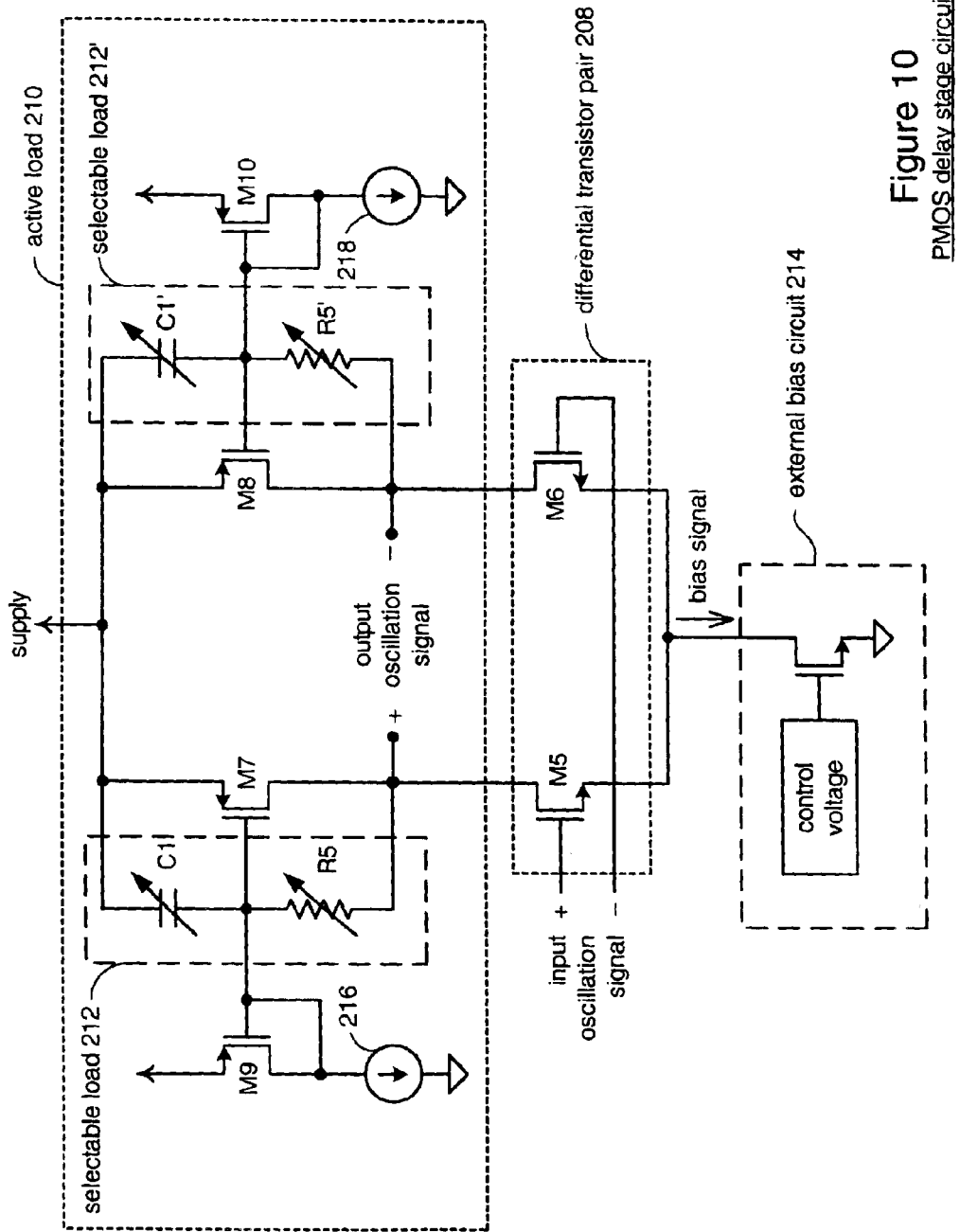
FIG. 10 is a schematic block diagram of an alternate embodiment of the present invention.

FIG. 10 is a schematic block diagram of an alternate embodiment of the present invention. Referring now to FIG. 10, a PMOS delay stage circuit comprises a differential transistor pair 208, comprising MOSFET transistor M5 and M6, coupled to receive an input oscillation signal and to produce therefrom an output oscillation signal characterized by a delay relative to the input oscillation signal. An active load 210 is further coupled to the drains of differential transistor pair 208. Active load 210 comprises current mirrors and selectable loads 212 and 212' coupled to each of the drains of differential transistor pair 208 that defines the delay of the delay stage circuit and, therefore, the oscillation frequency of the ring oscillator. An external bias circuit 214 further provides a bias signal to produce a fine adjustment on the oscillation frequency.

A current mirror comprising MOSFET device M7, current mirror reference device M9, and a current source 216 is coupled in parallel with selectable load 212 comprising adjustable capacitive device C1 and adjustable resistive device R5. Current mirror reference device M9 and current source 216 produce a reference current that is reproduced by MOSFET device M7 as is known by one of average skill in the art. Similarly, a current mirror reference device M10 and a current source 218 produce the reference current that is mirrored by MOSFET device M8. Current sources 216 and 218 determine the reference current through diode connected current mirror reference devices M9 and M10 thereby setting a constant source-to-gate voltage. The source-to-gate voltage is coupled to the gates of MOSFET devices M7 and M8 to produce a current in the MOSFET devices. The current produced in MOSFET devices M7 and M8 will be proportional to the current in the current mirror reference devices, the proportionality determined by the respective sizes (scaling) of MOSFET device M7 relative to current mirror reference device M9 and MOSFET device M8 relative to current mirror reference device M10 if the devices are biased in the saturation region. In one embodiment, however, the load devices are biased in the linear region. Accordingly, the proportionality in the scaling would not necessarily be reflected in the relative current flows since current flow is a function of bias signal levels. Current source 216 also allows adjustment of a feedback point common mode.

Adjustable capacitive devices C1 and C1' and adjustable resistive devices R5 and R5' of selectable loads 212 and 212' are connected from gate-to-source and from gate-to-drain, respectively, on each of the pair of MOSFET devices M7 and M5. The delay value of the PMOS delay stage is determined by the R-C values of adjustable resistive device R5 (and R5') and adjustable capacitive device C1 (and C1').

Figure 11:
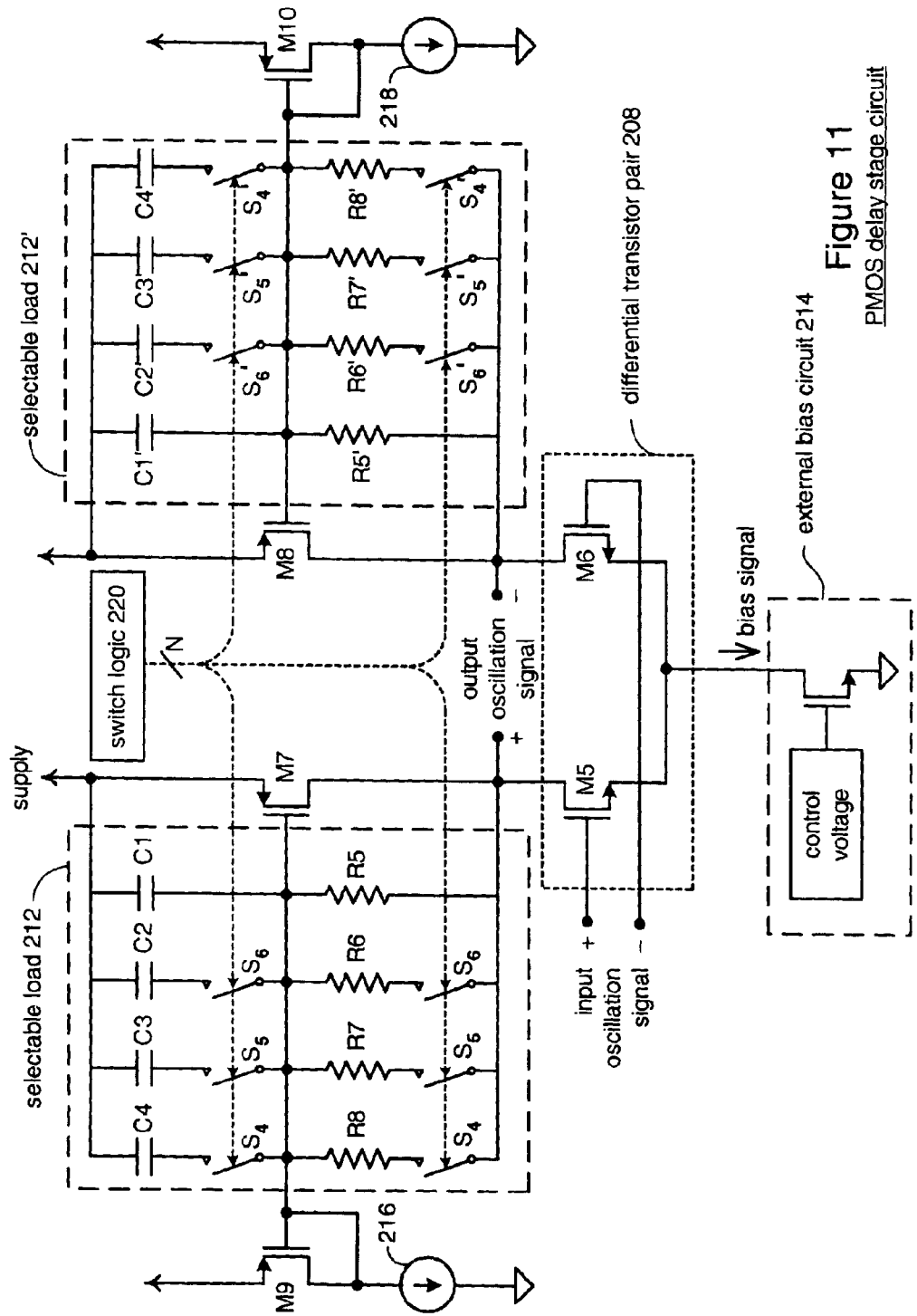
FIG. 11 is a schematic block diagram of a PMOS delay stage circuit according to an alternate embodiment of the present invention.

FIG. 11 is a schematic block diagram of a PMOS delay stage circuit according an alternate embodiment of the present invention. FIG. 11 illustrates the adjustable resistive device and adjustable capacitive device of FIG. 10 as comprising capacitive devices C1 through C4 (and C1' through C4') and resistive devices R5 through R8 (and R5' through R8'). As can be seen in FIG. 11, resistive devices R5 and R5' and capacitive devices C' and C1' are permanently coupled across each of the pair of MOSFET devices M7 and M8, respectively. Additional, the source-to-gate capacitance (not shown) of MOSFETs M7 and M8 is coupled in parallel with capacitive devices C1 through C4 and C1' through C4', respectively.

The scaled parallel coupled resistive devices R5 through R8 and R5' through R8', and scaled parallel coupled capacitive devices C1 through C4 and C1' through C4' are selectively coupled into the PMOS delay stage by switch logic 220. In operation, switch logic 220 selects one or more resistive and capacitive devices to select a delay of the delay stage and consequently the operating frequency of the ring oscillator. Switch logic 220 selects a capacitive device each time it selects a resistive device for each of the pair of MOSFET devices M7 and M8 and vice-versa. For example, when switch logic 220 closes, switches S4/S4', capacitive elements C4/C4' and resistive elements R8/R8' are selectively coupled to the gate terminals of MOSFET devices M7 and M8. Similarly, switch logic 220 can selectively close switches S5/S5' and S6/S6' as necessary to produce a desired delay which further characterizes the oscillation frequency of the ring oscillator. In an alternate embodiment, the capacitors may be selected independently from the resistors and vice-versa. As is known to one of average skill in the art, switches S4 through S6 (and S4' through S6') are typically formed as MOSFET switches characterized by a very low on resistance and a very high off resistance. At least one resistive device may be formed as a resistor configured MOSFET or a traditional resistive device. Similarly, at least one capacitive device may be formed as a capacitor configured MOSFET or a traditional capacitive device.

Figure 12:
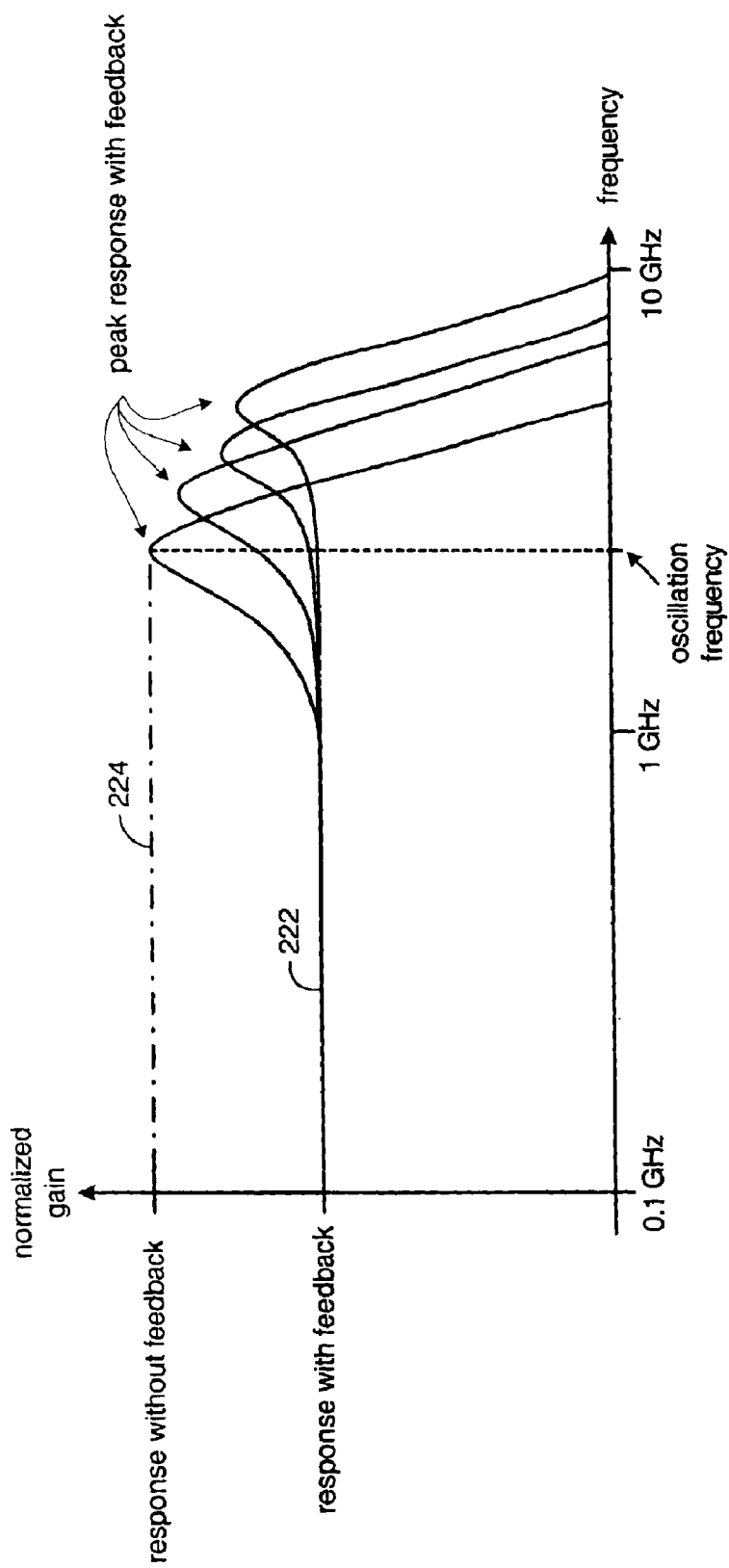
FIG. 12 is a graph of a PMOS delay stage response according to one embodiment of the present invention.

FIG. 12 is a graph of a PMOS delay stage response according to one embodiment of the present invention. The PMOS delay stage utilizes negative feedback from the output oscillation signal back to MOSFET devices M7 and M8. At low frequencies, the negative feedback is coupled through the resistive elements, namely, resistive elements R5 through R8 (and R5' through R8') of FIG. 11, to the gates of MOSFET M7 and M8 and reduces gain as shown by response line 222 away from the oscillation frequency. At the oscillation frequency, the R-C value of selectable load 212 is at a maximum value as illustrated by response line 224. As the frequency increases beyond the peak value, the decreasing impedance value of the capacitive elements of selectable load 212 reduces the gain of MOSFET devices M7 and M8 causing the peak response to roll off. In one embodiment of the present invention, capacitive devices C1 through C4 (and C1' through C4') and resistive devices R5 through R8 (and R5' through R8') are selected to define a total delay through the ring oscillator resulting in oscillation frequencies of 2.5, 3.125, 4.0 and 5.0 GHz.

Figure 13:
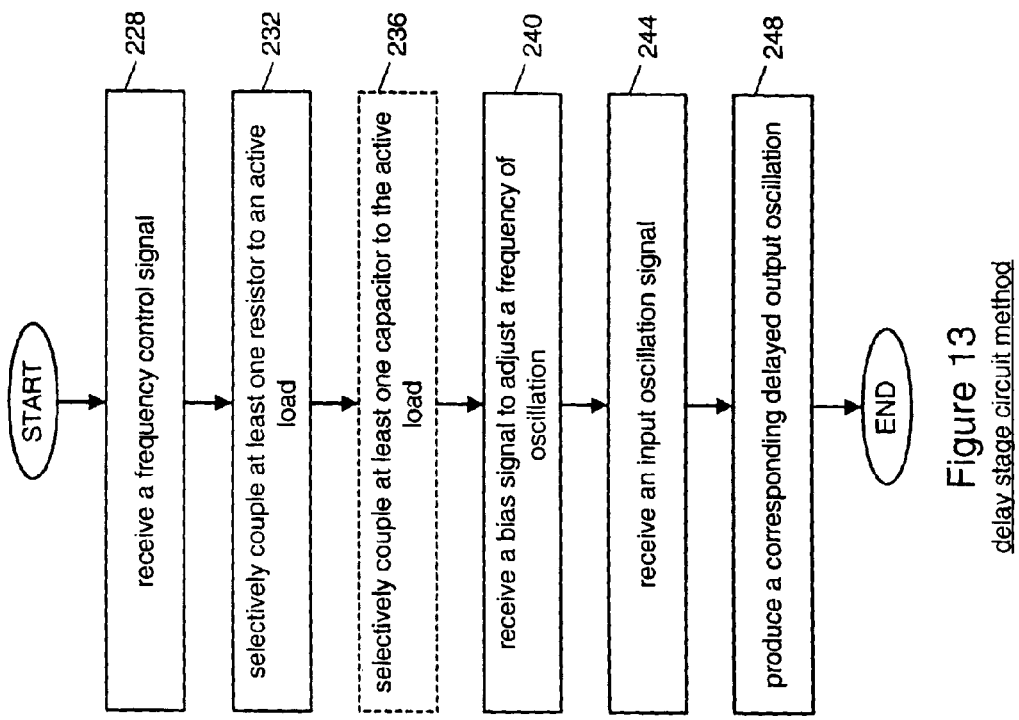
FIG. 13 is a flow chart of a method according to one embodiment of the present invention.

FIG. 13 is a flowchart of a method according to one embodiment of the present invention. A delay stage circuit receives a frequency control signal (step 228) that selects a delay of the delay stage circuit and ultimately an oscillation frequency of a ring oscillator. The invention further includes selectively coupling at least one resistor to an active load (step 232) and optionally coupling at least one capacitor to the active load (step 236). The at least one resistor and the at least one capacitor generate an R-C time constant of the active load that determines the delay of the delay stage circuit. The delay stage receives a bias signal to adjust a frequency of oscillation (step 240). The bias signal determines an operating current level in a differential transistor pair further adjusting the delay of the delay stage circuit. The differential transistor pair receives an input oscillation signal (step 244). The delay produced by the bias current and by the active load R-C time constant will produce a corresponding delayed output oscillation (step 248).

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A delay stage circuit of a ring oscillator for setting a delay value of the delay stage circuit and a corresponding frequency of operation of the ring oscillator, the delay stage circuit comprising:
a differential transistor pair for receiving an input oscillation signal and for producing a corresponding output oscillation signal characterized by a delay, wherein the differential transistor pair is coupled to receive a bias signal set by an external bias circuit;
an active load further comprising a pair of MOSFET devices, each having a drain coupled to a supply, a source coupled to a drain of one device of the differential transistor pair and a gate coupled to a selectable resistive load that is further coupled to the supply; and
wherein the selectable resistive load comprises a plurality of resistive devices that, when coupled in series with a gate-to-source capacitance provided by the pair of MOSFET devices, generates a desired R-C time constant to define the delay of the differential transistor pair.

2. The delay stage circuit of claim 1 wherein the selectable resistive load further includes a plurality of parallel coupled resistors wherein at least one resistor is selectable.

3. The delay stage circuit of claim 2 wherein the at least one selectable resistor is a resistor configured MOSFET.

4. The delay stage circuit of claim 2 wherein the at least one selectable resistor is a traditional resistive element coupled in series with a selectable switch.

5. The delay stage circuit of claim 2 wherein the selectable resistive load further includes a plurality of scaled parallel coupled resistors that, when selected and coupled to the gate-to-source capacitance of a corresponding active load, provide an R-C time constant that generates a corresponding delay.

6. The delay stage circuit of claim 5 wherein the total delay of the delay elements of the ring oscillator results in a frequency of operation of the ring oscillator that is approximately equal to one of 2.5 GHz, 3.125 GHz, 4.0 GHz, and 5.0 GHz.

7. A ring oscillator, comprising:
a plurality of delay stages coupled serially in a loop, each delay stage further comprising an input for receiving an oscillation signal and an output for producing a corresponding oscillation signal characterized by a delay;
a bias circuit for selectively providing a bias signal to the plurality of delay stages to adjust the delay of the corresponding output oscillation signal;
wherein each delay stage further includes:
a differential transistor pair for receiving an input oscillation signal and for producing a corresponding output oscillation signal characterized by the delay, wherein the differential transistor pair is coupled to receive the bias signal provided by the bias circuit; and
an active load comprising a pair of MOSFET devices, each having a drain coupled to a supply, a source coupled to a drain of one device of the differential transistor pair and a gate coupled to a selectable resistive load that is further coupled to the supply; and
wherein the selectable resistive load comprises a plurality of resistive devices that, when coupled in series with a gate-to-source capacitance provided by the pair of MOSFET devices, generates a desired R-C time constant to define the delay of the differential transistor pair.

8. The ring oscillator of claim 7 wherein a frequency of oscillation of the ring oscillator is a function of the delay of each delay stage circuit of the ring oscillator as set by the selectable resistive load and as a function of the externally provided bias signal that adjusts a bias level of the differential transistor pair.

9. The ring oscillator of claim 7 wherein the selectable resistive load further includes a plurality of parallel coupled resistors wherein at least one resistor is selectable.

10. The ring oscillator of claim 9 wherein the at least one selectable resistor is a resistor configured MOSFET.

11. The ring oscillator of claim 9 wherein the at least one selectable resistor is a traditional resistive element coupled in series with a selectable switch.

12. The ring oscillator of claim 9 wherein the selectable resistive load further includes a plurality of parallel coupled resistors that, when selected and coupled to the gate-to-source capacitance, provides an R-C time constant that generates a corresponding delay.

13. The ring oscillator of claim 12 wherein the total delay of the delay stages of the ring oscillator results in a frequency of operation of the ring oscillator that is approximately equal to one of 2.5 GHz, 3.125 GHz, 4.0 GHz, and 5.0 GHz.

14. A delay stage circuit of a ring oscillator for setting a delay value of the delay stage and a corresponding frequency of operation of the ring oscillator, the circuit comprising:
- a differential transistor pair for receiving an input oscillation signal and for producing a corresponding output oscillation signal characterized by a delay, the differential transistor pair coupled to receive a bias signal set by an external bias circuit;
- an active load comprising a pair of current mirrors, each current mirror including:
  - a MOSFET mirror device each having a source coupled to a supply, a drain coupled to a drain of each device of the differential transistor pair and a gate coupled to a selectable load;
  - a current mirror reference device coupled to the gate of the MOSFET device, the current mirror reference device for setting a current level in the MOSFET mirror device; and
  - wherein the selectable load coupled to the gate of the MOSFET device comprises a plurality of capacitive devices coupled between the gate of the MOSFET device and the supply, a plurality of resistive devices coupled between the gate of the MOSFET device and the drain of the MOSFET device, and wherein the resistive and capacitive devices generate a desired R-C time constant to define the delay of the differential transistor pair.

15. The delay stage circuit of claim 14 wherein a frequency of oscillation of the ring oscillator is a function of the delay of each delay stage circuit of the ring oscillator as set by the selectable load and as a function of the externally provided bias signal that adjusts a bias level of the differential transistor pair.

16. The delay stage circuit of claim 14 wherein the selectable load further includes at least one selectable resistive device and a corresponding selectable capacitive device.

17. The delay stage circuit of claim 14 wherein the at least one of the plurality of resistive devices is a resistor configured MOSFET.

18. The delay stage circuit of claim 14 wherein the at least one of the plurality of capacitive devices is a capacitor configured MOSFET.

19. The delay stage circuit of claim 14 wherein the at least one of the plurality of resistive devices is a traditional resistive element coupled in series with a selectable switch.

20. The delay stage circuit of claim 14 wherein the at least one of the plurality of capacitive devices is a traditional capacitive element coupled in series with a selectable switch.

21. The delay stage circuit of claim 14 wherein the selectable loads further include a plurality of scaled parallel coupled resistors that, when selected and coupled in series with a plurality of scaled parallel coupled capacitors, provide an R-C time constant that generates a corresponding delay.

22. The delay stage of claim 21 wherein the total delay of the delay stages of the ring oscillator result in a frequency of operation of the ring oscillator that is approximately equal to one of 2.5 GHz, 3.125 GHz, 4.0 GHz, and 5.0 GHz.

23. A programmable multi-gigabit transceiver, comprising:
- programmable physical media attachment (PMA) transmit and receive module for transmitting and receiving high-speed serial data;
- phase-locked loop (PLL) circuitry producing clock signals for transmit and receive operations of the PMA transmit and receive module; and
- a ring oscillator of the PLL further including a plurality of delay stages circuits, each of the plurality of delay stage circuits further including:
  - a differential transistor pair coupled to receive an oscillation, the differential transistor pair coupled to an active load that generates a delay for an output oscillation of the differential transistor pair; and
  - wherein the active load further includes at least one of a selectable resistive and capacitive element.

* * * * *